United States Patent [19]

Maeda et al.

[11] Patent Number: 4,746,397
[45] Date of Patent: May 24, 1988

[54] TREATMENT METHOD FOR PLATE-SHAPED SUBSTRATE

[75] Inventors: Nobuhisa Maeda, Yamatotakada; Takashi Suzuki, Toyonaka; Shigeyuki Yamamoto, Nara, all of Japan

[73] Assignee: Matsushita Electric Industrial Co., Ltd., Osaka, Japan

[21] Appl. No.: 3,716

[22] Filed: Jan. 15, 1987

[30] Foreign Application Priority Data

Jan. 17, 1986 [JP] Japan .................. 61-8208
Jan. 17, 1986 [JP] Japan .................. 61-8209
Jan. 17, 1986 [JP] Japan .................. 61-8210

[51] Int. Cl.$^4$ ............... H01L 21/306; B44C 1/22; C03C 15/00; C03C 25/06
[52] U.S. Cl. ..................... 156/637; 134/32; 134/34; 156/643; 156/646; 156/653; 156/657; 156/659.1; 156/662; 156/345
[58] Field of Search ............ 156/637, 638, 639, 646, 156/648, 643, 653, 657, 659.1, 662, 345; 134/32, 34

[56] References Cited

U.S. PATENT DOCUMENTS 3,291,640 12/1966 Livingston .............. 156/637 X
4,448,635 5/1984 Kuiken et al. .......... 156/637
4,468,283 8/1984 Ahmed ................... 156/642

Primary Examiner—William A. Powell
Attorney, Agent, or Firm—Wenderoth, Lind & Ponack

[57] ABSTRACT

A treatment method for plate-shaped substrate capable of uniformly performing the treating operation, performing a large amount of treatment, and facilitating the automation of the work independently of the surface nature of the substrate such as base plates of Si wafer for integrated circuit manufacturing use. The method is achieved by making it easier for the whole substrate surface to be wetted with the treatment liquid, through exposing the substrate to liquid or gas material which is soluble mutually with a treatment liquid prior to treatment with the treating liquid, to avoid treatment and thus uneven treatment to improve the yield.

17 Claims, 2 Drawing Sheets

TREATMENT METHOD FOR PLATE-SHAPED SUBSTRATE

BACKGROUND OF THE INVENTION

The present invention relates to a treatment method which makes it possible to perform the uniform treatment of a plate-shaped substrate, which has fine unevenness upon the surfaces represented for instance, a base plate for integrated circuit (IC) manufacturing use, a disc plate for image recording use, and a base plate for liquid-crystal display use when the surface treatment such as washing, etching, fat removing, resist friction or the like is applied by the use of the various kinds of liquid chemicals (hereinafter referred to as treatment liquid).

By way of example, in the following detailed description, the etching and washing of the base plate for IC manufacturing use (hereinafter referred to as Si wafer) which demands the uniformity and washing degree of the treatment particularly in these fields will be described.

The conventional etching methods of Si wafer are
The conventional etching methods of Si wafer are as follows.

1. A method of being dipped in the etching liquid (hereinafter referred to as a first method).

2. A method of jetting the etching liquid from the nozzles, rotating the Si wafer (as described within Japanese Patent Application publication (unexamined) Tokkaisho No. 53-8577, Japanese Patent Application Publication (unexamined) Tokkaisho No. 54-7874, Japanese Patent Application Publication (unexamined) Tokkaisho No. 56-27931, Japanese Patent Application Publication (unexamined) Tokkaisho No. 58-122732, Japanese Patent Application Publication (unexamined) Tokkaisho No. 58-196024, Japanese Patent Application Publication (unexamined) Tokkaisho No. 59-103344, Japanese Patent Application Publication (unexamined) Tokkaisho No. 59-204238) (hereinafter referred to as a second method).

3. A method of performing an etching method under the reduced pressure (as disclosed in the Japanese Patent Application Publication (examined) Tokkosho No. 60-7382) (hereinafter referred to as a third method).

Also, as the method of washing the Si wafer, existing circumstances are that the washing operation is performed by the joint use of auxiliary means for oscillating the Si wafer with most of the Si wafer being dipped in the washing liquid, or for applying the ultrasonic waves.

However, the conventional art has the following problems in the treatment such as washing or etching.

1. In the above-described first method, air is attached on the corner portion of the pattern or in the small indentation formed on the Si wafer surface to prevent the Si wafer from coming into contact against the treatment liquid to cause the uneven treatment.

Particularly, when the hydrophilic portion of the $SiO_2$ film or the like, and the hydrophobic portion of Si, Si film nitride or the like are mixed on the Si wafer surface, the bubbles are likely to be attached onto the boundary line therebetween to often cause the uneven treatment.

Also, the air contained in the contact hole for wiring use or in the trench formed on the Si is not easy to eliminate, and the treatment thereof cannot be applied into the contact hole or the trench.

2. As the treatment liquid of the above-described second method has kinetic energies, the air bubbles are generally likely to be somewhat removed more than the first method. However, air-bubbles are often caused (especially when the hydrophobic portion exists therein) all thr more, because the bubbles are caused when the treatment liquid collides with the Si wafer. Also, even in the second method, the effects are hardly provided in the removing operation of the air bubbles within the contact hole or the trench to cause the uneven treatment. Furthermore, the treatment liquid is likely to be scattered in all directions to cause a problem in the operation safety. 3. As gas to be caused by the etching reaction is removed in the above-described third method, the etching chamber is normally kept under the reduced condition during the treatment of the Si wafer. However, in the treatment where the gas is not caused through the reaction as in the etching of, for example, $SiO_2$ with fluoric acid or in the etching of Si of the Si nitride with phosphoric acid, the large air bubbles attached when the Si wafer has been dipped in the treatment liquid are inflated further by the reduced pressure to provide the sufficient buoyance so that the large bubbles are disconnected from the wafer surfaces. However, the small air bubbles cannot get sufficient buoyance for disconnection if they are inflated, and, then, they remain attached on the Si wafer surfaces as large bubbles during the pressure-decreasing time. The volume of the air bubbles is inflated unexpectedly 25.3 times as much under the decreased pressure of, for example, 30 Torr. Even the air bubbles of such size as may be neglected under the atmospheric pressure have large influences upon the uneven etching applied on the Si under the decreased pressure to deteriorate the uniformity. In addition, acid corrosion gas such as HF or the like is produced in large amount so as to normally retain the decreased pressure, which causes not only further corrosion of the pressure decreasing apparatus such as rotary pump or the like, but also shortens the service life of the pressure decreasing apparatus.

SUMMARY OF THE INVENTION

Accordingly, an object of the present invention is to provide a treatment method for a plate-shaped substrate which is capable of uniformly performing the treating operation, performing a large amount of treatment, and facilitating the automation of the work independently of the surface nature of a substrate to be treated such as Si wafer or the like.

Another object of the present invention is to provide a treatment method for a plate-shaped substrate which is achieved by making it easier for the whole treated substrate to be wet with the treatment liquid, through exposing the substrate to a liquid or gas material which is mutually soluble with the treatment liquid, prior to treating the substrate with the treatment liquid, to avoid the uneven treatment thereof, thereby to improve the yield.

Namely, for accomplishment of the above objects, the present invention provides a treatment method of dipping a substrate to be treated such as a plate in treatment liquid to apply the treatment after the substrate has been exposed to a liquid or gas of a material which is mutually soluble with the treatment liquid, and thereafter removing the treatment liquid and attached to the treated substrate efficiently.

Also, the present invention includes a treatment method of decreasing the pressure within a container, after a substrate to be treated has been brought into treatment liquid within the container provided with means for decreasing the pressure therein, to restore the pressure to the atmospheric pressure again, thereafter completing the treatment to remove the treatment liquid attached on the treated substrate.

Furthermore, the present invention includes a treatment method of decreasing the pressure within a container, after the liquid which is soluble with treatment liquid has been brought into contact against a substrate to be treated within the container provided with means for decreasing pressure therein, to restore the pressure to the atmospheric pressure, thereafter bringing the treated substrate into contact against the treatment liquid to complete the treatment, and, then, removing the treatment liquid attached on the treated substrate.

Also, the present invention includes a treatment method of separately placing a substrate to be treated and treatment liquid within a container provided with means for decreasing the pressure therein to decrease the pressure within the container to remove gas on the surfaces of the substrate, thereafter restoring the pressure located within the container to the atmospheric pressure after the substrate has been brought into contact against the treatment liquid under the decreased pressure, thereafter removing the treatment liquid attached on the treated substrate.

Also, the present invention includes a treatment method of individually placing a substrate to be treated and liquid soluble with treatment liquid respectively within a contrainer provided with an apparatus for decreasing the pressure therein, restoring the pressure provided within the container to the atmospheric pressure, after the substrate has been brought into contact against the liquid soluble with the treatment liquid under the decreased pressure, to apply the treatment upon the substrate with the treatment liquid, thereafter removing the treatment liquid attached on the treated substrate.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE INVENTION

Before the description of the present invention proceeds, it is to be noted that like parts are designated by like reference numerals throughout the accompanying drawings.

EMBODIMENT 1

Figure 1:
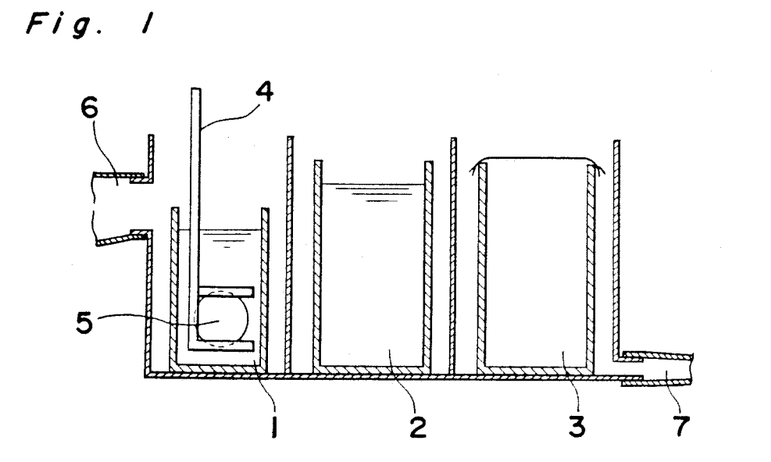
FIG. 1 and FIG. 4 are cross-sectional views of a treating apparatus to be used in the embodiment of the treatment method of the present invention.
Figure 2:
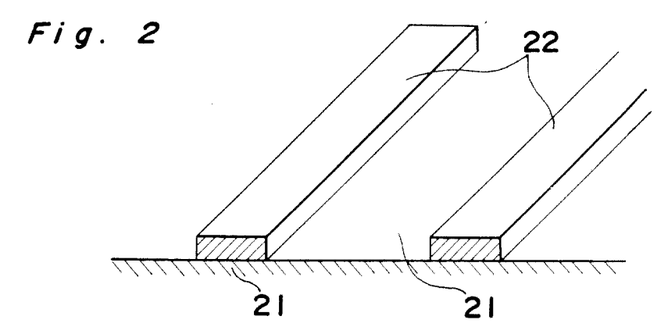
FIG. 2 is a perspective view with the line shaped pattern of the $SiO_2$ being formed on the Si wafer surface through the dry etching to be employed in the treatment method of the present invention.

Referring now to the drawings, there is shown in FIG. 1, an etching apparatus of Si wafer according to a first embodiment of the present invention, which includes isopropanol 1 as liquid soluble with treatment liquid 2, the treatment liquid 2 employed as an etching liquid for Si wafer, rinsing water 3, a retaining jig 4 (hereinafter referred to as hanger) for Si wafer, the Si wafer 5 as a substrate to be treated, an exhaust port 6 for evacuating gaseous isopropanol or fluorine, and a drain port 7 for draining overflown water 3. With the above, the experimental, practical method according to the embodiment of the present invention will be described in detailed hereinafter. Hot $SiO_2$ films of 3000 Å, 10,000 Å and 20,000 Å are formed through the various period of treatment time by a pyrogenic method on the face of the Si wafer 5 having a diameter of 5 inches and sliced by the crystalline face of (1, 0, 0). Thereafter, the photoresistance is applied on the face of Si wafer 5 in the thickness of 1.2 μm so that many line-shaped patterns lack being 1.5 μm in width, 0.5 in length, separated by 5 μm are developed on the entire Si wafer 5. The Si wafer 5 is dry-etched in $SiO_2$ film by the use of the mixed gas (pressure 700 m Torr) between $CHF_3$ and $C_2F_6$. Thereafter, the photoresistances are removed by the resistance ascha of the oxygen plasma. According to the observation by a microscope, the Si wafer 5, even in the Si wafer of any film thickness, provides at this time a hydrophilic $SiO_2$ pattern 22 formed in the rectilinear shape on the hydrophobic Si monocrystal 21 as shown in FIG. 2.

On the other hand, the etching liquid 2 of $SiO_2$ including fluoric acid and water having a mixing ratio of 1:200 as treatment liquid of the Si wafer 5, and the isopropanol having surface tension of 22.9 dyne/cm as liquid soluble with the etching liquid are put separately into a cell in the etchinhg apparatus shown in FIG. 1. It is to be noted that the isopropanol is normally circulated by a bellows pump and filtered by the filter (0.1 μm) made of fluorine-resin film (not shown). Pure water 3 having specific resistance value of 18 MΩ·cm as the rinsing water is overflowed from the cell top-portion, normally flowing.

After the Si wafers 5 formed in the pattern are retained one by one by the hanger 4 and are quietly dipped in the isopropanol 1 for three minutes, they are pulled up from the isopropanol and are dipped in the etching liquid 2 for five minutes. According to the visual observation of the surfaces of the Si wafer 5 from the tower upper portion while the Si wafer 5 is dipped in the etching liquid, no air bubbles are attached on the Si wafers 5 of the film thickness. The Si wafers whose etching is finished are spin-dried after the sufficient washing operation with the pure water 3.

According to the microscope observation of the Si wafers 5, whose treatment operation is completed, the $SiO_2$ film is etched and is made smaller in film thickness and width even in any Si wafer pattern, with no unevenness on the patterns.

Figure 3:
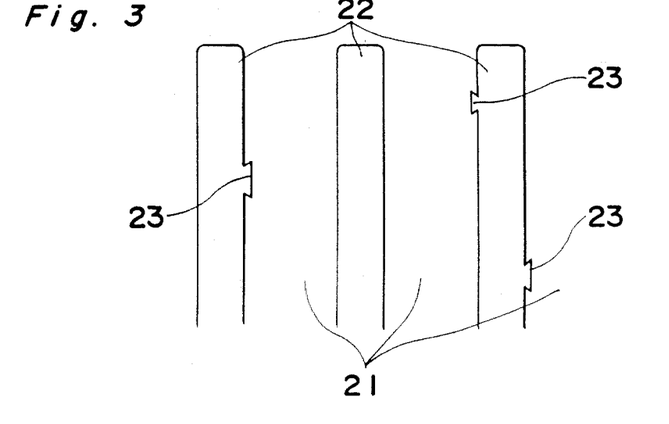
FIG. 3 is a plan view of the Si wafer showing the condition of the etching remaining through the etching operation when the air bubbles have been attached on the Si wafer.

On the other hand, as a first comparison embodiment for comparison, the Si wafer 5 provides the pattern of the SiO$_2$ film formed through the dry etching to remove the resistance. Then, the Si wafer is quietly dipped in etching liquid 2 directly without being dipped in the isopropanol 1. According to the observation the surfaces of the Si wafer 5 from the upper portion of the cell, several air bubbles are observed on the surface of the Si wafer 5. The Si wafer 5 is dipped for five minutes in the etching liquid 2, thereafter is dipped sufficiently in pure water 3, and is spin-dried. Then, according to the microscope observation of the surface of the Si wafer 5, the rectilinear pattern is out of shape, the pattern is recognized in which the convex portion 23 non-etched is provided on the end face of SiO$_2$ film. The SiO$_2$ films are observed particularly in the Si wafer 5 of 10,000 Å and 20,000 Å. This is because the air bubbles are attached when the Si wafer 5 is dipped in the etching liquid 2, and the bubble-attached locations remain without being etched.

Also, the similar experiments are performed even about n-propanol having surface tension of 25.3 dyne/cm, methanol having surface tension of 24.0 dyne/cm, ethanol having surface tension of 24.1 dyne/cm, acetic acid having surface tension of 29.6 dyne/cm, acetone having surface tension of 26.3 dyne/cm, acetic methyl having surface tension of 28 dyne/cm, methyl ethyl ketone having surface tension of 26.8 dyne/cm, instead of isopropanol as liquid soluble with treatment liquid, but the convex portion 23 non-etched of FIG. 3 is not observed. (The mixing ratio of each liquid is defined by volume ratio.)

The material soluble with the treatment liquid to be used in the present embodiment is required to be properly selected in accordance with the type of the treatment, the properties of the substrate to be treated, the nature of the treatment liquid or the like. As the water treatment liquid is mainly used in the washing or the etching of the Si wafer, alcohols such as methanol, ethanol, n-propanol, isopropanol, glycol and so on, ketones such as acetone and so on, carboxylic-acid such as acetic acid and so on, esters such as methyl acetate, ethyl acetate and so on, amines such as ethyl amine and so on, further sulfonic acid, electro-kinetic activator or the like, including the above-described materials used, are provided as the material soluble with the treatment liquid to be used. Howerver, in the present invention, the simple substances or mixtures of any substance among them may be used. The methanol, ethanol, ethyl amine, acetic acid, methyl acetate, ethyl acetate, acetone, isopropanol, n-propanol or the like which is small in adsorption ability into the Si wafer, is likely to be displaced by the treatment liquid, and is 30 dyne/cm or smaller in surface tension.

These materials have a hydrophilic group of 13 OH, <O, —COOH, —COO—, SO$_3$H or the like and a hydrophobic alkyl group within the molecule. When the Si wafer is exposed to the liquid or the steam (gas), the hydrophilic group is preferentially adhered on the hydrophilic portion of the Si wafer, the hydrophobic group is preferentially adhered on the hydrophobic portion of the Si wafer to form an accumulation film so that the entire Si wafer is likely to get wet with the hydrophilic treatment liquid or lipophilic treatment liquid. Also, as these materials are soluble with the treatment liquid such as water, they are dissolved in the treatment liquid during the treatment, and are decomposed in the treatment liquid. Furthermore, the air bubbles are likely to be disconnected from the compound of 30 dyne/cm or less in surface tension with no air bubbles remaining on the Si wafer surface. Thus, the uniform treatment may be performed without the air bubbles attached on the Si wafer so that the Si surface is not polluted.

Furthermore, a method of dipping the Si wafer in the liquid material, a method of jetting and spraying the liquid material from the nozzles or the like onto the Si wafer retained horizontal or vertical, a method of heating the material soluble with the treatment liquid, or applying ultrasonic waves producing gas to expose the Si wafer to the atmosphere, or other methods are available as a method of exposing the Si wafer to the material soluble with the treatment liquid. In the present invention, any method may be used. The dipping method is more preferable, because the apparatus is simple and the risk of the gas explosion is small.

Also, a method of dipping the Si wafer in the pure water or jetting the pure water in a shower condition to perform the washing operation is generally used as a method of removing the treatment liquid attached on the Si wafer. In order to increase the washing effect, the functions of oscillating the Si wafer, causing the bubbling of the ultrasonic waves or the gas in the rinsing cell, or rapidly exchanging the rinsing water are added. In the present invention, any method may be used or the combination of a plurality of methods from them may be used. The present invention may use any method of spin drying, steam drying, blow-off drying or the like as the method of drying the Si wafer, or may use the combined method.

The above method of the present invention can be applied to the same treating performance even in the sheet-number treatment or the patch treatment independently of the number of the sheets to be treated.

EMBODIMENT 2

The second embodiment of the present invention will be described hereinafter.

The isopropanol placed in the glass beaker is dipped in the water bath heated to 100° C. to heat the isopropanol to 70° C. Thereafter, the glass beaker with the isopropanol in it is placed in a covered desiccator. The desiccator is filled with the steam of the isopropanol.

On the other hand, in the first embodiment, the pattern of the SiO$_2$ film is formed through the dry etching and the resistances are removed. Thereafter, the Si wafer 5 of 10,000 Å in SiO$_2$ film thickness is quietly placed for thirty minutes in the desiccator filled with the isopropanol steam, and is exposed to the isopropanol steam. The Si wafer 5 is retained by the hanger 4 of the etching apparatus used in the first embodiment, is dipped for five minutes in the etching liquid 2 including fluoric acid and water with a mixing ratio of 1:200, is washed with the pure water 3, thereafter is spin dried. The pattern of the Si wafer 5 is examined after the drying operation as in the first embodiment, but unevenness caused by a non-etched portion of the SiO$_2$ pattern does not exist.

Also, the same experiments are performed with the methanol, ethanol as the liquid soluble with the treatment liquid, thus showing the same results.

EMBODIMENT 3

The third embodiment will be described hereinafter. The mixed liquid between ethanol and acetic acid, (for example, with mixing ratios of ethanol to acetic acid being 6:4, 5:5 and 4:6), the mixed liquid between the ethanol and the water (for instance, with mixing ratios of ethanol to water being 8:2, 6:4, 5:5 and 4:6), the mixed liquid between the acetic acid and the water (for instance, with mixing ratios of acetic acid to water being 8:2, 6:4, 5:5 and 4:6), the mixed liquid between isopropyl alcohol and water, for instance, with mixing rations being 6:4, 5:5 and 4:6, and the mixed liquid of 1:1 between the isopropyl alcohol and ethanol are used as the liquid soluble with the treatment liquid on the etching apparatus used in the first embodiment. The pattern is examined after the etching, washing and drying as in the first embodiment, and uneven surfaces caused by a non-etched portion remaining are not recognized.

Furthermore, the RCA washing liquid ($NH_4OH$:-$H_2O_2$:$H_2O$ — 1:2:7; volume ratio, 80° C.) instead of the etching liquid in the first embodiment, and the isopropanol, methanol, ethanol as the liquid soluble with the RCA washing liquid, and the various kinds of mixed liquid are used to form the rectilinear $SiO_2$ pattern on the Si base plate in the method similar to that of the embodiment 1. The Si wafer is dipped for three minutes in the above-described liquid soluble with the RCA washing liquid, thereafter is dipped for ten minutes in the RCA washing liquid. Thereafter, the Si wafer is sufficiently washed with water, is dried, and the surface is observed, by SEM (scanning type electronic microscope), for foreign materials attached on the Si wafter surface. Five through ten foreign materials (per fifty linear patterns) are sparsely recognized independently of the unevenness on the Si wafer surfaces. A large difference is not caused in the condition of the foreign-material attached due to the differences among the liquids soluble with the RCA washing liquid.

The Si wafer is directly dipped in the RCA washing liquid without being dipped in the liquid soluble with the RCA washing liquid, is washed, water-washed, dried. Thereafter, according to the observation of the Si wafer surface by the SEM, comparatively more foreign materials are recognized on the contact portion between the side face of the linear pattern 22 of the $SiO_2$ and the Si crystal face 21, and a group of large foreign materials are confirmed to be located in places.

EMBODIMENT 4

The fourth embodiment of the present invention will be described hereinafter with reference to the drawings.

Figure 4:
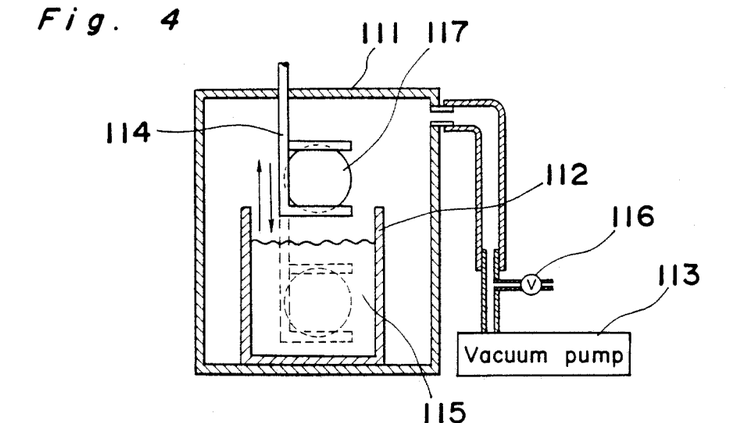

There is shown in FIG. 4, a container in section provided with a rotary pump 113 as means for reducing the pressure therein in the fourth embodiment of the present invention, which includes a container 111, a cell 112 for having the treatment liquid therein, a vacuum pump 113 as means for reducing the pressure, a stand 114 for having the Si wafer mounted thereon (hereinafter referred to as hanger), treatment liquid 115, a valve 116, an Si wafer as the substrate to be treated.

The $SiO_2$ film of 10,000 Å is formed by the pyrogenic method on the Si wafer (5 inches in diameter), whose surfaces are finished into mirror face through the slicing operation with the crystal face of (1, 0, 0), thereafter the photo-resistance is applied into the thickness of 1.2 $\mu$m. The line-shaped pattern of 100 $\mu$m in length, 0.5 $\mu$m through 4.0 $\mu$m in width (every 0.5 $\mu$m) is developed by plurality on the entire Si wafer.

Si wafer is etched in $SiO_2$ by the dry etching (with gas to be used, for instance, mixed gas of $CHF_3 + C_2F_6$ having pressure of 700 m Torr).

Figure 5:
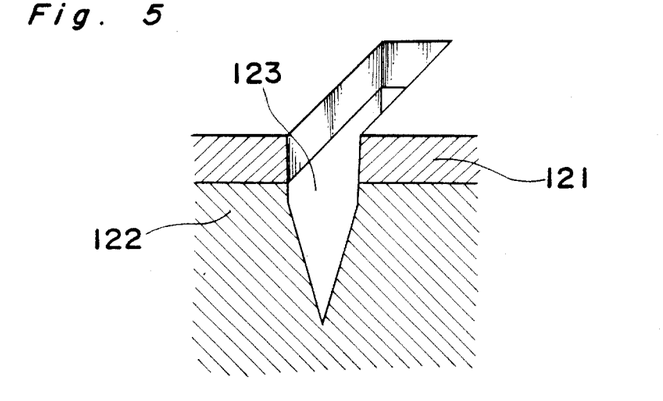
FIG. 5 is a schematic view showing the sectional shape of the groove when the groove has been formed through the dry etching in the treatment method of the present invention.

The Si wafer is etched further by the dry etching (with gas to be used, for instance, mixed gas of $CCl_4 + O_2$ having pressure of 80 m Torr) into the various depths (hereinafter referred to as the depths of the groove) of 1, 3, 5, 7 $\mu$m in the Si monocrystal through the variation of the etching time. Thereafter, the photoresistances are removed by the oxygen plasma. To observe the cross-sectional shape of the etching portion at this time by an electronic microscope (hereinafter referred to as SEM), one portion of the Si wafer is broken by the pattern forming portion. The condition is shown in FIG. 5. The bottom portion where the Si mono-crystal is etched (hereinafter referred to as groove) is made V in shape.

Figure 6:
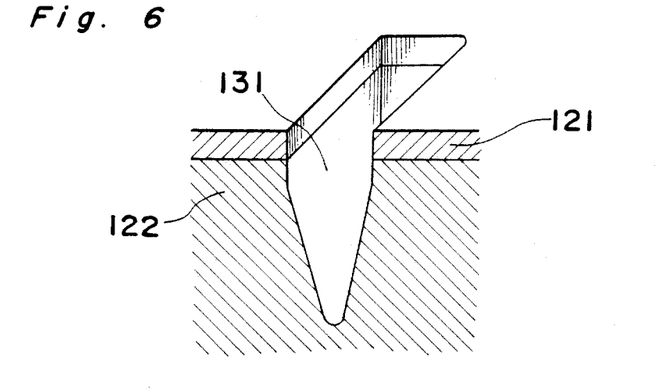
FIG. 6 is a schematic view showing the sectional shape of the groove when the wet etching has been performed with mixed acid.

The Si wafer, whose groove depth is etched by 5 $\mu$m is placed into the hanger of FIG. 4, the mixed acid between the fluoric acid and nitric acid ($HF$:$HNO_3$=3:97 (volume ratio), hereinafter referred to as mixed acid) as treatment liquid is placed into the cell 112. Thereafter, the container 111 is sealed, the hanger 114 is thrust in so that the Si wafer 117 is sunk completely into the mixed acid 115. Thereafter, the pressure within the container 111 is immediately reduced down to 30 Torr (15° C. at the liquid temperature of the mixed acid 115) by the use of the rotary pump 113. Thereafter, the hanger 114 is vibrated several times from the outside of the decompression container 117, the valve 116 is opened to introduce the air into the container 111 to restore the pressure to the atmospheric pressure. After the lapse of 15 minutes from the dipping of the Si wafer 117 in the mixed acid 115 it is removed from the hanger 114 with a pincette. Immediately the Si wafer is washed with a large amount of superpure water having specific resistance value of 18 M$\Omega$·cm, and, thereafter, is spin-dried at 5000 rpm. The etching is performed in the same manner even about the other Si wafers each being different in the groove depth. According to the observation of the Si wafer by the SEM, the side wall of the groove is uniformly etched with mixed acid to extend the groove width even in any pattern different in the groove width and the groove depth as shown in FIG. 6, with the groove bottom portion being changed to have such round shape from the V-shape like in FIG. 6. The mixed acid which is the wet etching treatment liquid of the Si wafer is penetrated into the entire groove so that the uniform treatment can be performed. Also, although many grooves are observed in the same manner across the entire Si wafer faces, the result is completely the same. Also, although the similar experiments are performed respectively at 50, 70, 100, 150 Torr, the results are the same.

On the other hand, the Si wafer is etched with the mixed acid without the pressure reduction within the container 111 with the use of the treatment apparatus shown in the fourth embodiment as a second comparison embodiment for comparison, by the method completely the same as that of the fourth embodiment in the other processes. It is found by the SEM observation (hereinafter referred to as the second comparison embodiment) that the portions where the interior portion of the groove is etched to extend the groove width are mixed with the portions where the groove width is not extended without the etching operation so as to cause the unevenness within the groove to make the etching unequal although the groove is etched with the mixed acid near the entrance thereof to extend the groove width even in any Si wafer different in the groove width and depth.

The operation of the treatment method in the above-described fourth embodiment will be described hereinafter.

The Si wafer which is the substrate to be treated is brought into contact against the treatment liquid within the container for decreasing the pressure therein. The pressure within the container is restored again to the atmospheric pressure after the pressure inside the container is reduced. The air bubbles which remain within the small unevenness on the Si wafer surface and are large enough to exert harmful influences upon the treatment are inflated to a large extent in the treatment liquid to disconnect them from the Si wafer surface through buoyancy.

Accordingly, the air bubbles do not prevent the concaved inner face of the Si wafer surface from coming into contact against the treatment liquid. The treatment liquid may be poured deep into the rear of the indentation by the atmospheric pressure if it may be different in size, thus resulting in uniform treatment (the thickness of the Si wafer of 5 inches in diameter with respect to the atmospheric pressure of 760 mm Hg' is 0.5 through 0.6 mm).

Also, the corrosion of the pressure-decreasing apparatus does not progress in the third treatment process of the conventional art even if the corrosive gas is caused, thus resulting in longer service life, because the pressure decreasing operation is temporarily performed.

Furthermore, the treatment method of the fourth embodiment has effects of applying the mechanical vibrations on the Si wafer, performing oscillations, and taking the Si wafer out of the treatment liquid for short time during the pressure reduction or stirring the treatment liquid by a pump, stirrer, ultrasonic waves or the like so as to disconnect the air bubbles as soon as possible.

EMBODIMENT 5

A fifth embodiment of the present invention will be described hereinafter.

In the fifth embodiment of the present invention, the RCA washing liquid including $NH_4OH$, $H_2O_2$ and $H_2O$ in a mixing volume ratio of 1:2:7 at 80° C., instead of the mixed acid for wet etching in the fourth embodiment, is used. In the other processes, the Si wafer is etched, washed with water, dried in the completely same manner as in the fourth embodiment. The number of particle-shaped foreign materials on the side wall of the groove is observed by the SEM.

Also, the above-described RCA washing liquid, instead of the mixed acid in the second comparison embodiment is used for comparison. The number of the particle-shaped foreign materials on the groove sidewalls (hereinafter referred to as the third comparison embodiment) is counted in the same manner as that of the second comparison embodiment. The counted number of the particle-shaped foreign materials in the fifth embodiment and the third comparison embodiment will be shown in the following Table 1.

It is to be noted that the counted value of Table 1 is the total of the foreign materials each being 0.3 μm or more in diameter among the fifth line-shaped grooves, which are of 1.5 μm in width, 100 μm in length, respectively. It may be found from the results that the treatment operation may be performed with the washing liquid down to the bottom of the deep concave portion by the use of the treatment method of the present invention.

TABLE 1

| Method of Washing Si Wafer | Number of Particles On Groove Side Wall |
| --- | --- |
| Fifth Embodiment | 7 |
| Third Embodiment | 30 |

EMBODIMENT 6

A sixth embodiment of the present invention will be described hereinafter.

In the sixth embodiment of the present invention, the line-shaped groove is formed on the Si wafer through the dry etching as in the fourth embodiment. The Si wafer is set in the hanger 114 shown in FIG. 4. Thereafter, the water which is liquid soluble with the mixed acid is put into the cell 112 to seal the pressure decreasing container 111. The hanger 114 is thrust in. The wafer 117 is dipped in the water. Then, the pressure-decreasing container is reduced inside as low as 20 Torr (15° C. at the low temperature) by a vacuum pump 113. Also, the hanger 114 is rotated in the pressure-decreased condition by four times or five times at the angle of about 45°. Thereafter, the valve is opened to restore the pressure of the decompression apparatus to the atmospheric pressure. Thereafter, the Si wafer is dipped in the mixed acid, is etched, washed with water and dried. According to the observation of the groove-shaped pattern portion by the SEM, the groove-bottom portion is changed into the round V-shape as in FIG. 6, also the side wall of the groove is uniformly wet-etched, and can be uniformly treated as in the fourth embodiment.

On the other hand, by the use of the apparatus shown in the sixth embodiment for comparison, the pressure within the decompression container 111 is not decreased, but the Si wafer is etched in the mixed acid in completely the same method as in the fifth embodiment. According to the SEM observation (hereinafter referred to as the fourth comparison embodiment), the groove is etched near the entrance thereof to extend the groove width even in any Si wafer different in the groove depth. However, the interior of the groove can be treated only in the unequal way as in the second comparison embodiment.

EMBODIMENT 7

A seventh embodiment of the present invention will be described hereinafter.

Methanol having surface tension of 24 dyne/cm, ethanol having surface tension of 24.1 dyne/cm, n-propyl alcohol and isopropyl alcohol having surface tension of 22.9 dyne/cm, acetone having surface tension of 26.3 dyne/cm, and methyl ethyl ketone having surface tension of 26.8 dyne/cm, acetic acid having surface tension of 29.6 dyne/cm, in methyl acetate, ethyl acetate and nonionic series interfacial activator diluted to 0.5% with water, mixture of 1:1 between ethanol and acetic acid, mixed liquid between ethanol and water at a mixing ratio of either 6:4 or 4:6, the mixed liquid between acetic acid and water at a mixing ratio of either 6:4 or 4:6 are used as the liquid soluble with the mixed acid which is the wet etching agent of the Si wafer. The wet etching is performed as in the sixth embodiment so that the groove bottom portion is changed into the round V-shaped likewise and the mixed acid for etching use is penetrated through the entire groove. Also, the similar examinations are performed with the use of the mixed liquid between methanol and water, isopropyl alcohol and water, or acetic acid and water, with the results being completely the same.

EMBODIMENT 8

An eighth embodiment of the present invention will be described hereinafter.

In the eighth embodiment of the present invention, the RCA washing liquid including $NH_4OH$, $H_2O_2$ and $H_2O$ at a ratio of 1:2:7, at 80° C., instead of the mixed acid for the wet etching in the sixth embodiment, is used. In the other processes, the Si wafer is etched, washed with water and dried in completely the same manner as in the sixth embodiment. The number of particle-shaped foreign materials on the side wall of the groove is observed by the SEM.

Also, the above-described RCA washing liquid, instead of the mixed acid in the fourth comparison embodiment, is used for comparison. The number of the particle shaped foreign materials on the groove side walls (hereinafter referred to as the fifth comparison embodiment) is counted in the same manner as that in the fourth embodiment. The counted number of the particle-shaped foreign materials in the eighth embodiment and the fifth comparison embodiment will be shown in the following Table 2.

It is to be noted that the counted value of Table 2 is the total of the foreign materials each being 0.3 μm or more in diameter among the fifty line-shaped grooves, which are of 1.5 μm in width, 100 μm in length respectively.

It may be found from the results that the treatment operation may be performed with the washing liquid down to the bottom of the deep concave portion by the use of the treatment method of the eighth embodiment.

It is to be noted that each of the above-described embodiments shows only the examples of the wet etching and the washing process of the Si wafer. The present invention may be applied not only to the examples, but also to all the processes of treating, with the use of the treatment liquid, a substrate which is shaped like a plate and has unevenness on the surfaces.

TABLE 2

| Method of Washing Si Wafer | Number of Particle-shaped Foreign Materials on Groove Side Wall |
|---|---|
| Eighth Embodiment | 7 |
| Fifth Embodiment | 35 |

In the treatment method of Embodiment 6 through Embodiment 8, the liquid which is soluble with such treatment liquid as described hereinabove is contacted with the surface of the substrate to be treated, thereafter the pressure in the container is reduced, then the pressure is restored to atmospheric pressure, and the large air bubbles in the concave portion are inflated by the decompression, are removed with buoyancy, and the liquid is gradually penetrated into the surface between the very few small air bubbles remaining on the surface of the substrate to permit the entire surfaces of the substrate to be wetted with the treatment liquid. It is possible for the interior of the decompression container to be made completely vacuum. The degree of vacuum increases only up to the steam pressure when the liquid exists with the decompression container. For example, it is about 20 Torr at 20° C. in the case of water. Accordingly, the air which is originally located in the concave portion of the substrate may be mostly removed by the decompression de-airing operation, but air in an amount equivalent to 20/760 of the volume of the concave portion remains as it is.

The decompression degree of the treating method in the sixth through the eighth embodiments is determined by the steam pressure of the treatment liquid. The vacuum arrival degree is up to about 20 Torr at 20° C. in the diluted liquid through the fluoric-acid water, the effective vacuum degree is within the range of 150 through 20 Torr (20° C.), preferably 40 through 20 Torr.

The various pumps such as rotary pump, diffusion pump, mechanical booster pump, water seal pump and so on which are generally used as vacuum pumps are provided as apparatuses for decreasing the pressure within the container. In the present invention, any pump may be used, and a plurality of combinations from among them may be used.

EMBODIMENT 9

A ninth embodiment of the present invention will be described hereinafter with reference to the drawings.

In sample and the apparatus used in the present embodiment are the same as those manufactured and used in the fourth embodiment. The line-shaped pattern of 100 μm in length, every 0.5 μm in width (or there may be employed a value of 0.5 through 4.0 μm in width), and 1, 3, 5, 7 μm in depth is formed on the surface, and, thereafter, the photoresistance is removed. The Si wafer like this is used. The treatment apparatus of FIG. 4, which is the same as that of the fourth embodiment, is used.

The Si wafer, whose groove depth is etched by 5 μm is placed into the hanger of FIG. 4, the mixed acid between the fluoric acid and the nitric acid ($HF:HNO_3$) in a mixing volume ratio of 3 to 97 (hereinafter referred to as a mixed acid) as treatment liquid is placed into the cell 112. Thereafter, the container 111 is sealed, the pressure within the container 111 is reduced to 30 Torr at 15° C. of the liquid temperature of the mixed acid 115 by the use of the rotary pump 113. Then, the hanger 114 is thrust in so that the Si wafer 117 is sunk completely into the mixed acid 115. Thereafter, the valve 116 is opened to introduce the air into the container 111 to restore the pressure to the atmospheric pressure. After the lapse of 15 minutes from the dipping of the Si wafer 117 in the mixed acid 115, the Si wafer 117 is lifted from the mixed acid 115 to take it out from the hanger 114 with a pincette. Immediately, the Si wafer is washed with a large amount of super-pure water having specific resistance value of 18 MΩ·cm, and thereafter, is spin-dried at 5000 rpm. The etching is performed in the same manner even about the other Si wafers each being different in the groove depth.

According to the observation of the Si wafer by the SEM, the side wall of the groove is uniformly etched with mixed acid to extend the groove width even in any pattern different in the groove width and the groove depth as shown in FIG. 6, with the groove bottom portion being changed to have such round shape as in FIG. 6 from the V-shape. The mixed acid which is wet etching treatment liquid of the Si wafer is penetrated into the entire groove so that the uniform treatment can be performed. Also, although many grooves are observed in the same manner across the entire Si wafer faces, the result is completely the same. Also, although the similar experiments are performed respectively at 50, 70, 100, 150 Torr, the results are the same.

On the other hand, the Si wafer is etched with the mixed acid without the pressure reduction within the container 111 with the use of the apparatus shown in the fourth embodiment for comparison by the method which is completely the same method as that of the ninth embodiment in the other processes. It is found by the SEM observation (hereinafter referred to as the fifth comparison embodiment) that the portions where the interior portion of the groove is etched to extend the groove width are mixed with the portions where the groove width is not extended without the etching operation so as to cause the unevenness within the groove to make the etching unequal although the groove is etched with the mixed acid near the entrance thereof to extend the groove width even in any Si wafer different in the groove width and depth.

EMBODIMENT 10

A tenth embodiment of the present invention will be described hereinafter.

In the tenth embodiment of the present invention, the RCA washing liquid including $NH_4OH$, $H_2O_2$, $H_2O$ in a volume ratio of 1:2:7 at 80° C., instead of the mixed acid for the wet etching use in the ninth embodiment, was used. In the other processes, the Si wafer is etched, washed with water, dried in the completely same manner as in the ninth embodiment. The number of particle-shaped foreign materials on the side wall of the groove is observed by the SEM.

Also, the above-described RCA washing liquid, instead of mixed acid used in the ninth comparison embodiment is used for comparison. The number of the particle-shaped foreign materials on the groove side walls (hereinafter referred to as the sixth comparison embodiment) is counted in the same manner. The counted number of the particle-shaped foreign materials is the tenth embodiment and the sixth comparison embodiment will be shown in the following Table 3.

It is to be noted that the counted value of Table 3 is the total of the foreign materials each being 0.3 $\mu$m or more in diameter among the fifty line-shaped grooves, which are of 1.5 $\mu$m in width, 100 $\mu$m in length, respectively.

It may be found from the results that the treatment operation may be performed with the washing liquid down to the bottom of the deep concave portion by the use of the treatment method of the present embodiment.

TABLE 3

| Method of Washing Si Wafer | Number of Particles on Groove Side Wall |
| --- | --- |
| Tenth Embodiment | 3 |
| Sixth Embodiment | 32 |

EMBODIMENT 11

An eleventh embodiment of the present invention will be described hereinafter.

In the eleventh embodiment of the present invention, the line-shaped groove is formed on the Si wafer through the dry etching as in the ninth embodiment. The Si wafer it set in the hanger 114 shown in FIG. 4. Thereafter, the water which is liquid soluble with the mixed acid is put into the cell 112 to seal the pressure-decreasing container 111. The pressure-decreasing container 111 is reduced inside as low as 20 Torr at 15° C. of the low temperature, by a rotary vacuum pump 113. Then, the hanger 114 is rotated in the pressure-decreased condition by four times or five times at the angle of about 45°, where the hanger is thrust in, and the wafer 117 is dipped in the water. Thereafter, the valve is opened to restore the pressure of the decompression apparatus to the atmospheric pressure. Thereafter, the Si wafer is dipped in the mixed acid, is etched, washed with water and dried. According, to the observation of the groove-shaped pattern portion by the SEM, the groove-bottom portion is changed into the round V-shape as in FIG. 6, also the side wall of the groove is uniformly wet-etched, and can be uniformly treated as in the ninth embodiment.

On the other hand, by the use of the apparatus shown in the eleventh embodiment for comparison, the pressure within the decompression container 111 is not decreased, in the other process steps the Si wafer is etched in the mixed acid in completely the same method as in the ninth embodiment. According to the SEM observation (hereinafter referred to as the seventh comparison embodiment), the groove is etched near the entrance thereof to extend the groove width even in any Si wafer different in the groove depth. However, the interior of the groove can be treated only in the unequal way as in the fifth comparison embodiment.

In the treatment method in the ninth through eleventh embodiments, the Si wafer and the treatment liquid are placed separately within the container provided with an apparatus for decreasing the pressure within the container, and the pressure within the container is decreased. Thus, the air on the wafer surfaces can be removed even if unevenness caused by fine or deep grooves exists. The Si wafer is brought into contact against the treatment liquid in this condition, thereafter the pressure is restored to the atmospheric pressure. Accordingly, the air bubbles do not prevent the concaved inner face of the Si wafer surface from coming into contact against the treatment liquid. The treatment liquid may be poured deep into the rear of the indentation by the atmospheric pressure if it may be different in size, thus resulting in uniform treatment. In this embodiment, the thickness of the Si wafer of 5 inches in diameter with respect to the atmospheric pressure 760 mmHg is 0.5 through 0.6 mm.

EMBODIMENT 12

A twelfth embodiment of the present invention will be described hereinafter.

In the treatment method of the twelfth embodiment of the present invention, the liquid soluble with the treatment liquid is brought into contact with the surface of the substrate to be treated under the decreased pressure, thereafter the pressure is restored to the atmospheric pressure. The liquid is gradually penetrated into the boundary between very few air bubbles remaining on the surfaces of the substrate so that the entire surface of the substrate may be wetted with the treatment liquid.

The concrete contents of the twelfth embodiment using the liquid will be described hereinafter. The kind of the liquid soluble with the treatment liquid to be used in the treatment method of the twelfth embodiment is the same as that used in the treatment method of the sixth through eighth embodiments, and the operation is also similar.

Methanol having surface tension of 24 dyne/cm, ethanol having surface tension of 24.1 dyne/cm, n-propyl alcohol and isopropyl alcohol having surface tension of 22.9 dyne/cm, acetone having surface tension of 26.3 dyne/cm, and methyl ethyl ketone having surface tension of 26.8 dyne/cm, acetic acid having surface tension of 29.6 dyne/cm, in methyl acetate, ethyl acetate and nonionic series interfacial activator diluted to 0.5% with water, mixture of 1:1 between ethanol and acetic acid, mixed liquid between ethanol and water at a ratio of either 6:4 or 4:6, the mixed liquid between acetic acid and water at a ratio of either 6:4 or 4:6 are used as the liquid soluble with the mixed acid which is the wet etching agent of the Si wafer. The wet etching is performed as in the eleventh embodiment so that the groove bottom portion is changed into the round V-shape likewise and the mixed acid for etching use is penetrated through the entire groove. Also, the similar examinations are performed with the use of the mixed liquid between methanol and water, isopropyl alcohol and water, or acetic acid and water, with the results being completely the same.

EMBODIMENT 13

A thirteenth embodiment of the present invention will be described hereinafter.

In the thirteenth embodiment of the present invention, the RCA washing liquid including $NH_4OH$, $H_2O_2$, $H_2O$ at a ratio of 1:2:7 at 80° C., instead of the mixed acid for wet etching use in the twelfth embodiment, is used. In the other processes, the Si wafer is etched, washed with water, dried in the completely same manner as in the twelfth embodiment. The number of particle-shaped foreign materials on the side wall of the groove is observed by the SEM.

Also, the above-described RCA washing liquid, instead of the mixed acid used in the seventh comparison embodiment is used for comparison. The number of the particle-shaped foreign materials on the groove side walls (hereinafter referred to as the eighth comparison embodiment) is counted in the same manner. The counted number of the particle-shaped foreign materials in the thirteenth embodiment and the eighth comparison embodiment will be shown in the following Table 4.

It is to be noted that the counted value of Table 4 is the total of the foreign materials each being 0.3 μm or more in diameter among the fifty line-shaped grooves, which are of 1.5 μm in width, 100 μm in length, respectively. It may be found from the results that the treatment operation may be performed with the washing liquid down to the bottom of the deep concave portion by the use of the treatment method of the present invention.

TABLE 4

| Method of Washing Si Wafer | Number of Particle-shaped Foreign Materials of Groove on Groove Side Wall |
|---|---|
| Thirteenth Embodiment | 2 |
| Eighth Comparison Embodiment | 35 |

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A treating method for a plate-shaped substrate comprising the steps of exposing a substrate to be treated to liquid or gas material which is soluble with treatment liquid and has a hydrophilic base and a hydrophobic base within the molecule of itself, thereafter dipping the substrate in the treatment liquid to apply the treatment, then removing said treatment liquid from the treated substrate.

2. The treating method in accordance with claim 1, wherein the liquid or gas material soluble with said treatment liquid is isopropanol.

3. The treating method in accordance with claim 1, wherein the substrate is a base plate, for manufacturing semiconductor elements, having fine unevenness on the surfaces.

4. A treating method for a plate-shaped substrate comprising the steps of contacting a substrate to be treated with a treatment liquid within a container which is provided with means for reducing pressure within the container, therafter reducing the pressure within said container and restoring the pressure to atmospheric pressure, and completing the treatment to remove said treatment liquid from the treated substrate.

5. The treating method in accordance with claim 4, wherein the substrate is a base plate, for manufacturing semiconductor elements, having fine unevenness on the surfaces.

6. The treatment method in accordance with claim 4, comprising the step of moving said substrate and the treatment liquid relative to each other while the substrate is dipped in the treatment liquid.

7. A treatment method for a plate-shaped substrate comprising the steps of contacting a substrate to be treated with a liquid which is soluble with a treatment liquid within a container provided with pressure reducing means, thereafter reducing pressure within said container and restoring the pressure to atmospheric pressure, then contacting the substrate with the treatment liquid, and completing the treatment to remove said treatment liquid from the treated substrate.

8. The treatment method in accordance with claim 7, wherein the liquid soluble with the treatment liquid is liquid containing a material having a hydrophilic base and a hydrophobic base within the molecule of itself and is at least of compound selected from compound soluble in water.

9. The treatment method in accordance with claim 7, wherein the substrate is an Si base plate, for manufacturing semiconductor elements, having fine unevenness on the surfaces.

10. The treatment method in accordance with claim 7, wherein the substrate and the treatment liquid are moved relative to each other while the substrate is being treated with the treatment liquid.

11. A treatment method for a plate-shaped substrate comprising the steps of separately placing a substrate to be treated and a treatment liquid within a container provided with means for reducing pressure within the container, thereafter contacting said substrate with said treatment liquid under reduced pressure and restoring the pressure within said container to atmospheric pressure, and completing the treatment to remove said treatment liquid from the treated substrate.

12. The treatment method in accordance with claim 11, wherein the substrate is a base plate, for manufacturing semiconductor elements, having fine unevenness on the surfaces.

13. The treatment method in accordance with claim 11, further comprising the step of moving the substrate by mechanical means while the substrate is dipped in the treatment liquid.

14. A treatment method for a plate-shaped substrate comprising the steps of separately placing a substrate to be treated and a liquid which is soluble with a treatment liquid in a container, reducing pressure within said container, contacting the substrate with the liquid soluble with said treatment liquid under the reduced pressure, thereafter restoring the pressure within said container to atmospheric pressure, then contacting the substrate with the treatment liquid, and thereafter removing said treatment liquid from the treated substrate.

15. The treatment method in accordance with claim 14, wherein the liquid soluble with the treatment liquid is liquid containing a material having a hydrophilic base and a hydrophobic base without the molecule of itself and is at least one compound selected from compounds soluble in the water.

16. The treatment method in accordance with claim 14, wherein the substrate is an Si base plate, for manufacturing semiconductor elements, having fine unevenness on the surfaces.

17. The treatment method in accordance with claim 14, further comprising the step of moving the substrate by mechanical means while the substrate is contacted with the treatment liquid.

* * * * *